(12) United States Patent
Pike

(10) Patent No.: US 7,996,178 B2
(45) Date of Patent: Aug. 9, 2011

(54) SEMICONDUCTOR SUBSTRATE PROCESSING METHOD AND APPARATUS

(75) Inventor: Alger C. Pike, San Francisco, CA (US)

(73) Assignee: Revera, Incorporated, Sunnyvale, CA (US)

( * ) Notice: Subject to any disclaimer, the term of this patent is extended or adjusted under 35 U.S.C. 154(b) by 0 days.

(21) Appl. No.: 12/781,714

(22) Filed: May 17, 2010

(65) Prior Publication Data

US 2010/0228374 A1 Sep. 9, 2010

Related U.S. Application Data

(62) Division of application No. 11/040,329, filed on Jan. 20, 2005, now Pat. No. 7,720,631.

(51) Int. Cl.
*G01C 9/00* (2006.01)
(52) U.S. Cl. ........................................ 702/152
(58) Field of Classification Search .................. 702/152
See application file for complete search history.

(56) References Cited

U.S. PATENT DOCUMENTS

| | | | |
|---|---|---|---|
| 5,805,866 A | 9/1998 | Magome et al. | |
| 5,806,866 A * | 9/1998 | Fleischer | 280/47.31 |
| 5,808,910 A | 9/1998 | Irie et al. | |
| 6,281,024 B1 | 8/2001 | Yoshitake et al. | |
| 6,876,946 B2 | 4/2005 | Yasuda et al. | |
| 7,330,261 B2 | 2/2008 | Van Haren et al. | |
| 7,388,213 B2 * | 6/2008 | Sullivan | 250/492.2 |
| 2003/0045131 A1 * | 3/2003 | Verbeke et al. | 438/795 |
| 2004/0258514 A1 | 12/2004 | Raaijmakers | |

FOREIGN PATENT DOCUMENTS

| | | |
|---|---|---|
| JP | 08 008175 A | 6/1996 |
| JP | 08008175 | 6/1996 |
| WO | WO98/44330 | 10/1998 |
| WO | WO00/26646 | 5/2000 |
| WO | WO02/088683 | 11/2002 |
| WO | PCT/US2005/042863 | 11/2005 |
| WO | WO2006/088527 | 8/2006 |

OTHER PUBLICATIONS

Non-Final Office Action from U.S. Appl. No. 11/040,329, mailed Jun. 10, 2009, 12 pgs.
Notice of Grounds for Rejection from Korean Patent Application No. 2007-7018933 mailed Mar. 30, 2009, 12 pgs.
Extended Search Report from EP07019258.8-2222 / 1876634 mailed Nov. 10, 2009, 7 pgs.

(Continued)

*Primary Examiner* — Aditya Bhat
(74) *Attorney, Agent, or Firm* — Blakely Sokoloff Taylor & Zafman LLP

(57) ABSTRACT

A semiconductor substrate processing apparatus and a method for processing semiconductor substrates are provided. The method may include providing a semiconductor substrate having a surface and a plurality of features on the surface, each feature being positioned on the surface at a first respective point in a first coordinate system, plotting the position of each feature at a second respective point in a second coordinate system; and generating a translation between the first and the second coordinate systems. The generating of the translation may include calculating an offset between the first and the second coordinate systems. The calculating of the offset may include calculating an offset distance between a reference point of the first coordinate system and a reference point of the second coordinate system and calculating an offset angle between an axis of the first coordinate system and an axis of the second coordinate system.

20 Claims, 15 Drawing Sheets

OTHER PUBLICATIONS

Written Report of Re-Examination from Korean Patent Application No. 2007-7018933 mailed Jan. 22, 2010, 2 pgs.

Notice of Ruling on Re-Examination from Korean Patent Application No. 2007-7018933 mailed Jan. 25, 2010, 1 pg.

Notice of Final Rejection from Korean Patent Application No. 2007-7018933 mailed Nov. 5, 2009, 2 pgs.

Examination Report from EP07019258.8-2222 / 1876634 mailed Mar. 22, 2010, 1 pg.

PCT Search Report PCT Application PCT/US2005/042863, mailed Nov. 8, 2005, 14 pgs.

International Preliminary Report on Patentability from PCT/US2005/042863 mailed Aug. 2, 2007, 7 pgs.

Non-Final Office Action from U.S. Appl. No. 11/040,329 mailed Dec. 10, 2008, 14 pgs.

Examination Report from European Application No. EP 05 847 786.0-2222 mailed Aug. 12, 2010, 4 pgs.

* cited by examiner

SEMICONDUCTOR SUBSTRATE PROCESSING METHOD AND APPARATUS

CROSS-REFERENCE TO RELATED APPLICATIONS

This application is a divisional of U.S. patent application Ser. No. 11/040,329, filed Jan. 20, 2005, the entire contents of which are hereby incorporated by reference herein.

BACKGROUND OF THE INVENTION

1) Field of the Invention

This invention relates to a method and apparatus for processing semiconductor substrates, particularly to a metrology tool for use in processing semiconductor substrates.

2) Discussion of Related Art

Integrated circuits are formed on semiconductor substrates such as wafers. The formation of the integrated circuits may include numerous processing steps such as deposition of various layers, etching some of the layers, and multiple bakes. The integrated circuits are then separated into individual microelectronic dice, which are packaged and attached to circuit boards.

During the various processing steps involved in the creation of the integrated circuits, various layers of different materials, such as conductors, dielectrics, and semiconductor, are formed on the surface of the wafer where the integrated circuits are being formed. The manufacturers of the integrated circuits often test the composition of the various layers to ensure that the proper materials are being deposited on the substrates.

The machines used to test the composition of the layers are often referred to as "metrology tools." The metrology tools emit electromagnetic radiation, such as x-rays from an x-ray source, which are deflected off a particular region of a substrate that is being tested. The metrology tools make use of analysis protocols, such as X-ray Photoelectron Spectroscopy (XPS), Total Reflection X-ray Fluorescence (TXRF), and ellipsometry, to measure particular characteristics of the substrate. If, for example, XPS is used, photoelectrons, or electrons, are emitted from the substrate and captured by an electron spectrometer or hemispherical analyzer. The analyzer determines the composition of the region of the substrate by analyzing the kinetic energy, or speed, of the photoelectrons.

The metrology tools typically use a robot to remove the substrate from a load-lock chamber and a separate "stage" to position the substrate into an analytical position under the x-ray source.

The need for the separate stage adds to the complexity of the metrology tool and increases the costs of the manufacturing the integrated circuits. Additionally, the stage moves in an unpredictable manner and the substrate is often not perfectly centered on the stage, which adds to the difficulty of locating the exact position of the particular features on the substrate that are to be tested. If the electromagnetic radiation is misdirected, the integrated circuits could be damaged.

SUMMARY OF THE INVENTION

The invention provides a semiconductor substrate processing apparatus and a method for processing semiconductor substrates. The method may include providing a semiconductor substrate having a surface and a plurality of features on the surface, each feature being positioned on the surface at a first respective point in a first coordinate system, plotting the position of each feature at a second respective point in a second coordinate system, and generating a translation between the first and the second coordinate systems. The generating of the translation may include calculating an offset between the first and the second coordinate systems. The calculating of the offset may include calculating an offset distance between a reference point of the first coordinate system and a reference point of the second coordinate system and calculating an offset angle between an axis of the first coordinate system and an axis of the second coordinate system. The method may further include providing a second semiconductor substrate having a surface and a plurality of second features on the surface, each second feature being positioned on the surface of the second semiconductor substrate at a third respective point in the first coordinate system, translating the third respective points in the first coordinate system into fourth respective points in the second coordinate system using said translation, and moving the second semiconductor substrate into a plurality of substrate positions, each substrate position corresponding to one of the fourth respective points in the second coordinate system.

BRIEF DESCRIPTION OF THE DRAWINGS

The invention is described by way of example with reference to the accompanying drawings, wherein.

DETAILED DESCRIPTION OF THE INVENTION

Figure 1:
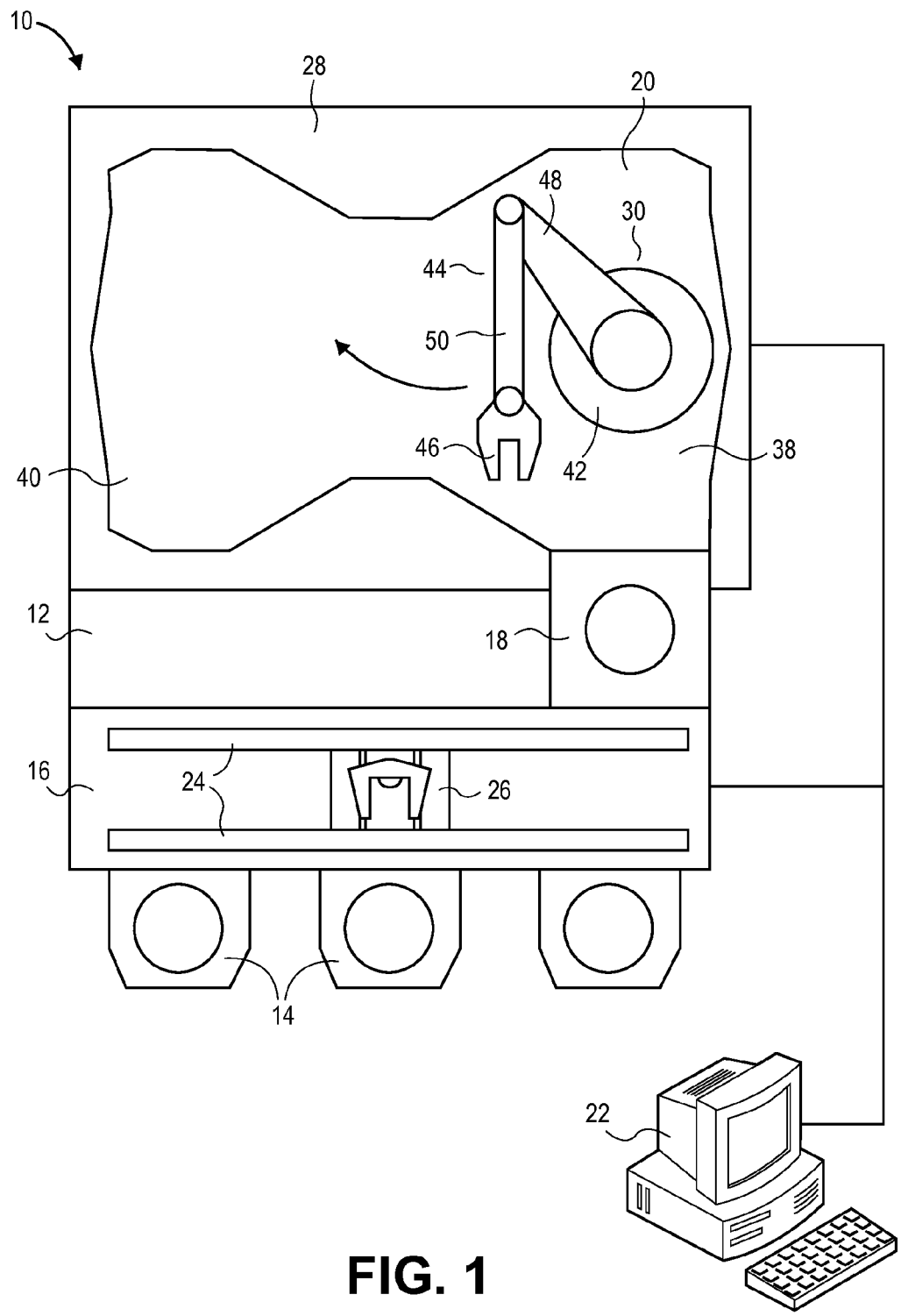
FIG. 1 is a top plan schematic view of a semiconductor processing apparatus including a metrology chamber.

In the following description, various aspects of the present invention will be described, and various details set forth in order to provide a thorough understanding of the present invention. However, it will be apparent to those skilled in the art that the present invention may be practiced with only some or all of the aspects of the present invention, and the present invention may be practiced without the specific details. In other instances, well-known features are admitted or simplified in order not to obscure the present invention.

An embodiment of the present invention provides what is known in the art as a "metrology tool" and a method of calibrating a metrology tool. The metrology tool may include a robotic stage with a substrate support. A substrate, having a plurality of features on an upper surface thereof, may be both retrieved and transferred into a target area of an electromagnetic radiation source by the robotic stage. The electromagnetic radiation source may emit electromagnetic radiation, such as x-rays, onto the features. The x-rays may cause photoelectrons to be emitted from the features that are captured and analyzed to determine the composition of the features.

In order to accurately direct the x-rays onto the features, the exact location of the features on the substrate must be known. This is made difficult because the substrate is often misplaced on the substrate support, resulting in the substrate being "off-center" from its ideal position. Additionally, the movements of the robotic stage may be somewhat unpredictable and imprecise, which further adds to the difficulty because the exact position of the substrate support itself may not be known at any given time.

An embodiment of the present invention provides a method and apparatus for calibrating a metrology tool so that the exact position of the substrate on the substrate support may be known. The calibration may also compensate for the inherent inaccuracy and imprecision in the movements of the robotic stage so that the exact position of the substrate support itself may be known.

It should be understood that FIGS. 1 through 7B are merely illustrative and may not be drawn to scale.

FIG. 1 to FIG. 9D illustrate a semiconductor substrate processing apparatus and a method for processing semiconductor substrates. The method may include providing a semiconductor substrate having a surface and a plurality of features on the surface, each feature being positioned on the surface at a first respective point in a first coordinate system, plotting the position of each feature at a second respective point in a second coordinate system, and generating a translation between the first and the second coordinate systems. The generating of the translation may include calculating an offset between the first and the second coordinate systems. The calculating of the offset may include calculating an offset distance between a reference point of the first coordinate system and a reference point of the second coordinate system and calculating an offset angle between an axis of the first coordinate system and an axis of the second coordinate system. The method may further include providing a second semiconductor substrate having a surface and a plurality of second features on the surface, each second feature being positioned on the surface of the second semiconductor substrate at a third respective point in the first coordinate system, translating the third respective points in the first coordinate system into fourth respective points in the second coordinate system using said translation, and moving the second semiconductor substrate into a plurality of substrate positions, each substrate position corresponding to one of the fourth respective points in the second coordinate system.

FIG. 1 illustrates an embodiment of a semiconductor wafer processing system, or a metrology tool 10. The metrology tool 10 may include a frame 12, wafer cassettes 14, a transport subsystem 16, a load-lock chamber 18, a metrology chamber 20, and a computer control console 22. The frame 12 may be substantially square with the wafer cassettes 14 attached at a first end thereof. The transport subsystem 18 may lie adjacent to the cassettes 14.

The wafer cassettes 14 may lie at one end of the frame 12 and may be Front Opening Unified Pods (FOUPs), as is commonly understood in the art. The cassettes 14 may be sized and shaped to hold a plurality of semiconductor substrates, such as wafers, with diameters of, for example, 200 or 300 millimeters.

The transport subsystem 16 may include a transport track 24 and a transport mechanism 26. The transport track 24 may be connected to the frame 12 and extend between opposing sides of the frame 12 near the wafer cassettes 14. The transport mechanism 26 may be able to support semiconductor substrates, such as wafers with diameters of, for example, 200 or 300 mm and transport the substrates between each of the cassettes 14 and the load-lock chamber 18.

The load-lock chamber 18 may be connected to the frame 12 between the transport subsystem 16 and the metrology chamber 20. As is commonly understood in the art, the load-lock chamber 18 may include a first door adjacent to the transport subsystem 16 and a second door adjacent to the metrology chamber 20. Both doors may be able to hermetically seal the transport subsystem 16 from the metrology chamber 20.

Figure 2:
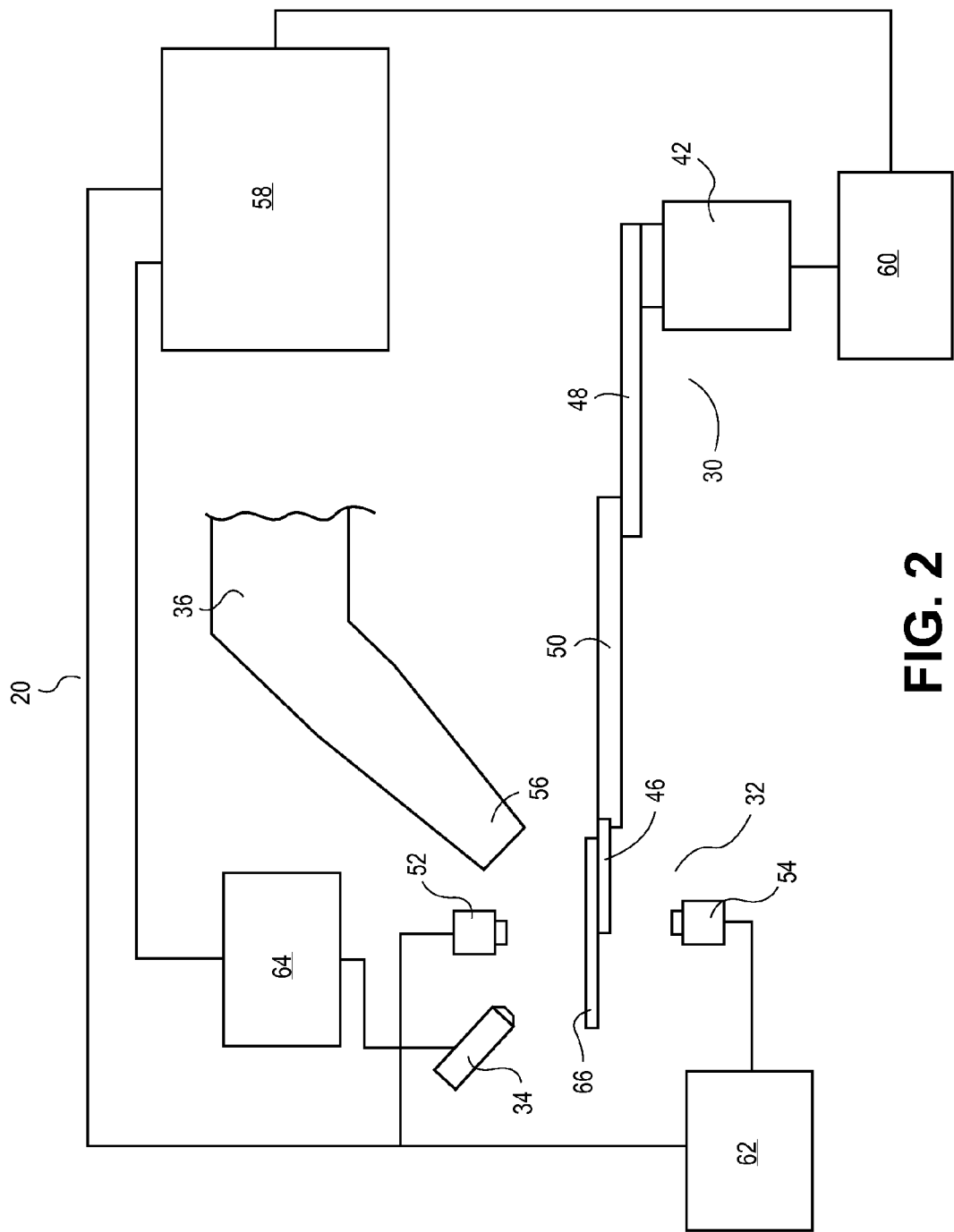
FIG. 2 is a cross-sectional side schematic view of the metrology chamber.

Referring to FIG. 1 in combination with FIG. 2, the metrology chamber 20 may include a chamber wall 28, a robotic stage 30, a camera subsystem 32, an electromagnetic radiation source subsystem 34, and a metrological analyzer 36. The chamber wall 28 may have an inner surface with an "hour glass" shape as illustrated in FIG. 1, and thus divide the metrology chamber 20 into first 38 and second 40 portions. The first portion 38 may be nearer the load-lock chamber 18.

Although not shown for clarity, it should be understood that all of the components within the metrology chamber 20 may be connected to the frame 12 and/or the chamber wall 28. Furthermore, all of the components of the metrology tool 10 may include various actuators to produce the movements thereof and power supplies to supply power thereto.

The robotic stage 30 may lie within the first portion 38 of the metrology chamber 20 and may include a base 42, a robotic arm 44, and a substrate support 46. The robotic arm 44 may be rotatably connected to the base 42 and include a first segment 48 attached directly to the base 42 and a second segment 50 that is pivotably attached to the first segment 48. The substrate support 46 may be connected to the second segment 50 of the robotic arm 44 at an end opposing the first segment 48. The substrate support 46 may be sized and shaped to support semiconductor substrates, such as wafers with diameters of, for example, 200 or 300 mm. The robotic stage 30 may be able to extend the substrate support 46 into the second portion 40 of the metrology chamber 20, as well as into the load-lock chamber 18.

As illustrated in FIG. 2, the camera subsystem 32 may lie within the second portion 40 of the metrology chamber 20 and may include an upper 52 and a lower 54 camera. The upper camera 52 may be positioned at a height higher than the substrate support 46 of the robotic stage 30 and be oriented such that a field of view thereof is directed substantially downwards. The lower camera 54 may be positioned at a height lower than the substrate support 46 and be oriented such that a field of view thereof is directed substantially upwards. The upper 52 and the lower 54 cameras may be charged coupled device (CCD) cameras, as is commonly understood in the art. Although not illustrated, it should be understood that the camera subsystem 32 may include other equipment such as lenses and other focusing aids to magnify and adjust the image captured by the cameras 52 and 54.

The electromagnetic radiation source subsystem 34 may be an x-ray source, such as an x-ray gun, as is commonly understood in the art, positioned within the second portion 40 of the metrology chamber 30, and may oriented, or "pointed," between the upper 52 and the lower 54 cameras. It should be noted that the electromagnetic radiation source subsystem 34 may also emit other types of electromagnetic radiation, such as visible light.

The upper camera 52, the lower camera 54, and the electromagnetic radiation subsystem 34 may be moveably connected to the frame 12 and/or the chamber wall 28 so that they may be able to change the orientation thereof relative to the substrate support 46.

The metrological analyzer 36 may include an aperture 56 positioned opposite the x-ray source subsystem 34, and although not illustrated in detail, may also include a detector and an electron spectrometer or hemispherical analyzer, as is commonly understood in the art.

The metrology tool 10, or the metrology chamber 20, may also include a wafer position controller 58, a robotic stage controller 60, a vision controller 62, and a beam controller 64. The robotic stage controller 60 may be electrically connected to the robotic stage 30 and the wafer position controller 58. The vision controller 62 may be electrically connected to the camera subsystem 32 and the wafer position controller 58. The beam controller 64 may be electrically connected to the electromagnetic radiation source subsystem 34 and the wafer position controller 58.

The computer control console 22 may be in the form of the computer having memory for storing a set of instructions in a processor connected to the memory for executing the instructions, as is commonly understood in the art. The instructions stored within the computer control console 22 may include methods and processes, as well as various algorithms in order to carry out the methods and processes, for the movements, calibration, and operation of the metrology tool 10 as described below. The instructions may further include what is commonly understood to be "pattern recognition" software and software for translating between Cartesian and polar coordinates. The computer control console 22 may be electrically connected to the transport subsystem 16, the load-lock chamber 18, and the metrology chamber 20, as well as all of the components within the metrology chamber 20. The computer control console 22 may also be electrically connected to, and work in conjunction with, the wafer position controller 58, the robotic stage controller 60, the vision controller 62, and the beam controller 64 to control the operation of the metrology tool 10.

Figure 3:
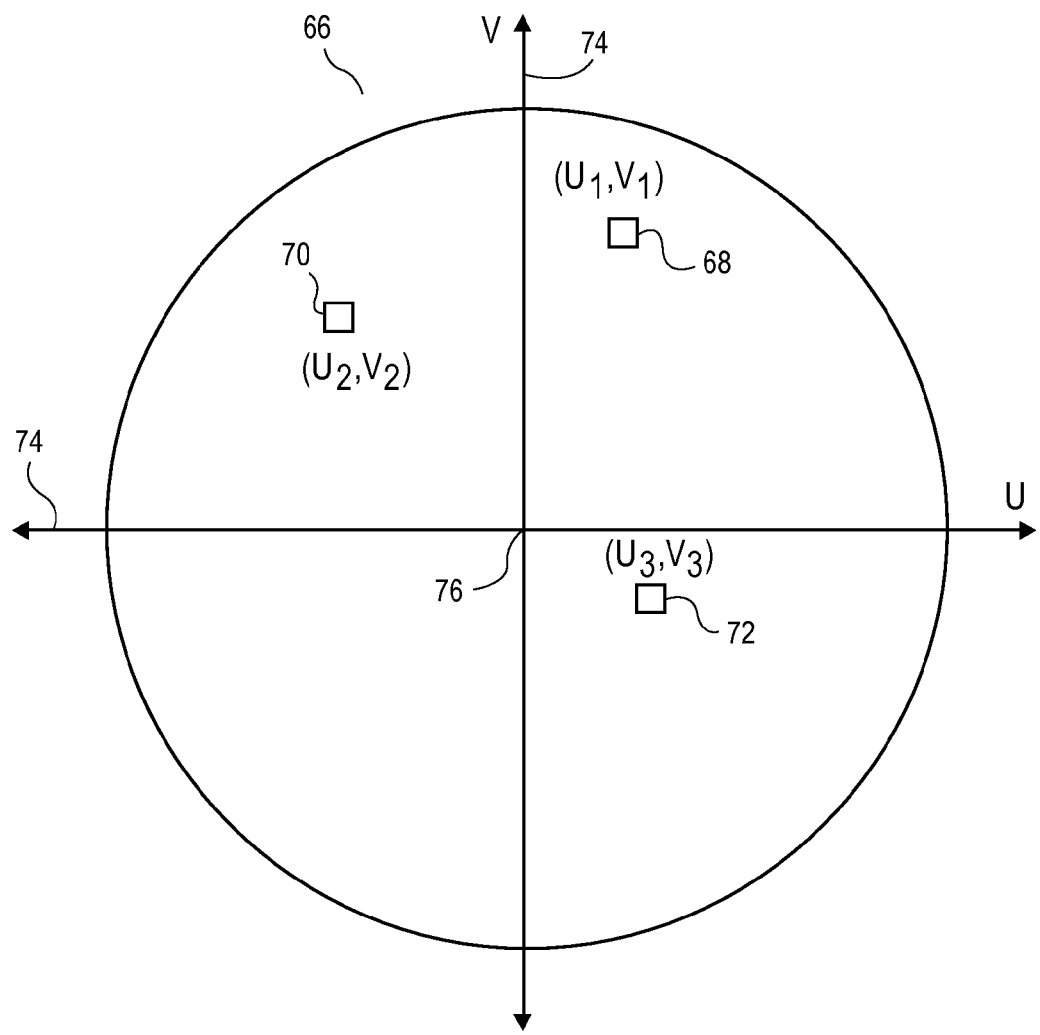
FIG. 3 is a top plan view of a calibration substrate.

In use, as illustrated in FIGS. 1 and 3, a calibration substrate 66 may be inserted into one of the wafer cassettes 14. The calibration substrate 66 may be a semiconductor wafer with a diameter of, for example, 200 or 300 mm. The calibration substrate 66 may include a first 68, a second 70, and a third 72 "feature" on an upper surface thereof. The features 68,70, and 72 may be metrology pads as is commonly understood in the art. It should be understood that although only three features 68, 70, and 72 are shown and described, there may actually be several thousand such features on the calibration substrate 66.

As illustrated in FIG. 3, the features 68, 70, and 72 may lie on the substrate 66 in a substrate, or U/V, coordinate system 74. The substrate coordinate system, or the U/V co-ordinate system 74, may be a Cartesian coordinate system having a "U-axis" and a "V-axis" and an origin 76, or reference point, which may be positioned near the center of the substrate 66. The first feature 68 may be positioned within the U/V coordinate system 74 at a first point ($U_1, V_1$). The second feature 70 may be positioned within the U/V coordinate system 74 at a second point ($U_2, V_2$). The third feature 72 may be positioned within the U/V coordinate system 74 at a third point ($U_3, V_3$).

Referring again to FIG. 1, the transport mechanism 26 may retrieve the calibration substrate 66 from the cassette 14 and transport the calibration substrate 66 into the load-lock chamber 18. The robotic stage 30 may then retrieve the calibration substrate 66 from the load-lock chamber 18 and carry the calibration substrate 66 from the first portion 38 of the metrology chamber 20 to the second portion 40 of the metrology chamber 20. As illustrated in FIG. 2, the robotic stage 30 may position the calibration substrate 66 between the upper 52 and lower 54 cameras. The computer control console 22 may control the robotic stage 30 in such a way that when the robotic arm 44 is moved, the substrate support 44, the first segment 48 of the robotic arm 44, and second segment 50 of the robotic arm do not contact the chamber wall 28.

Figure 4:
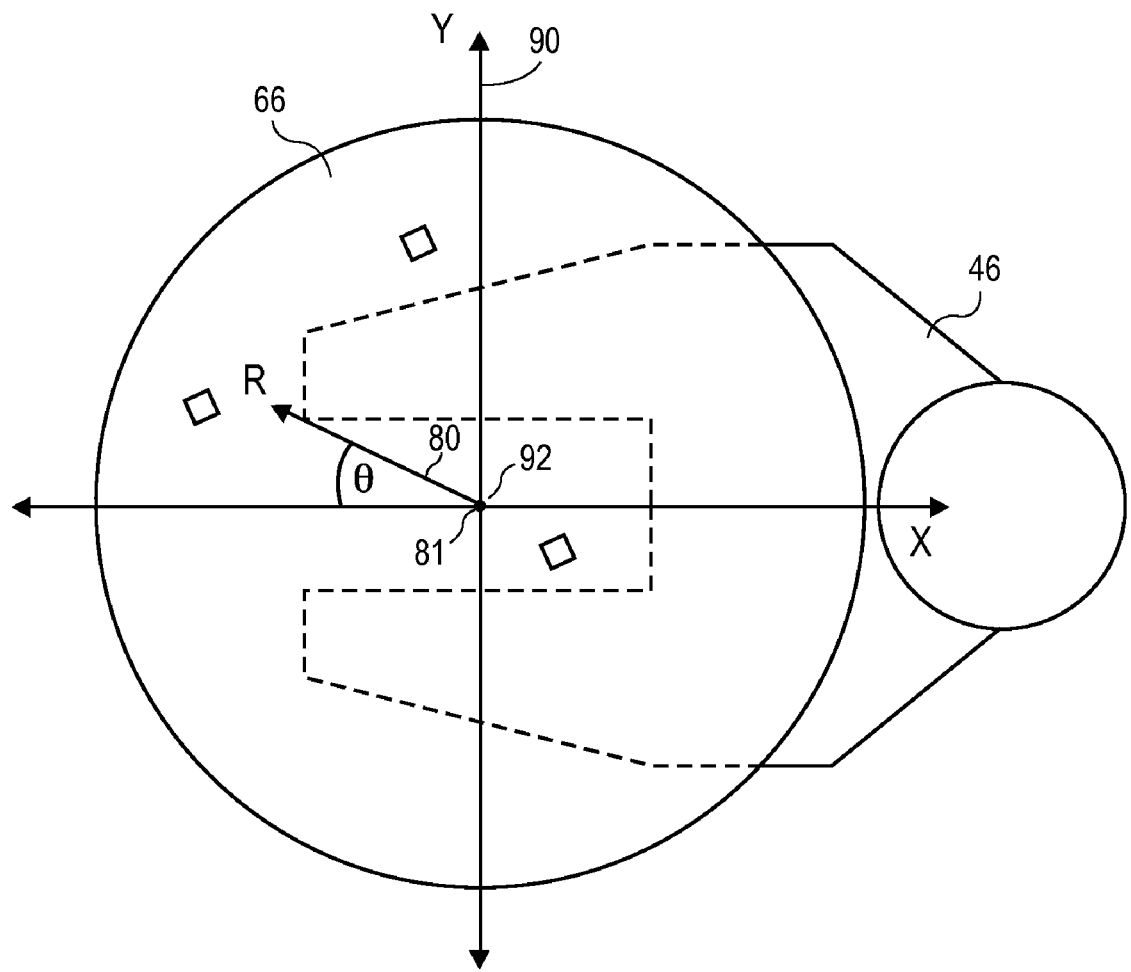
FIG. 4 is a top plan view of the calibration substrate placed on a substrate support, or robotic stage, within the metrology chamber.

FIG. 4 illustrates the substrate support 46 with the calibration substrate 66 placed thereon. As dictated by the structure of the robotic stage 30, the robotic arm may move the substrate support 46, and thus the calibration substrate 66, in a polar coordinate system 80 (R,θ) with an origin 81, or reference point, which may be understood to be positioned at a central portion of the substrate support 46. It should be noted that the origin 81 of the polar coordinate system 80 may not actually be located at a central portion of the substrate support 46.

As illustrated, the metrology tool 10, in particular the computer control console 22, may include, or generate, a "translation" of the R/θ coordinate system 80 into a second Cartesian, or X/Y, coordinate system 90, which may correspond to the movement of the calibration substrate 66 caused by the robotic arm 44. The X/Y coordinate system 90 may have an "X-axis," a "Y-axis," and an origin 92, or reference point, located approximately at a central portion of the substrate support 46. The origin 81 of the R/θ coordinate system 80 may be congruent with the origin 92 of the X/Y coordinate system 90. The X/Y coordinate system 90 may be similar to the U/V coordinate system 74 of the calibration substrate 66, illustrated in FIG. 3.

Although as illustrated in FIG. 4, the X/Y coordinate system 90 may appear to be congruent with the U/V coordinate system 74, which is not specifically illustrated in FIG. 4, it should be understood that such is not necessarily true, as is described below. In other words, the origin 76 of the U/V coordinate system 74 illustrated in FIG. 3, may not lie directly over the origin 92 of the X/Y coordinate system 90 illustrated in FIG. 4.

Figure 5A:
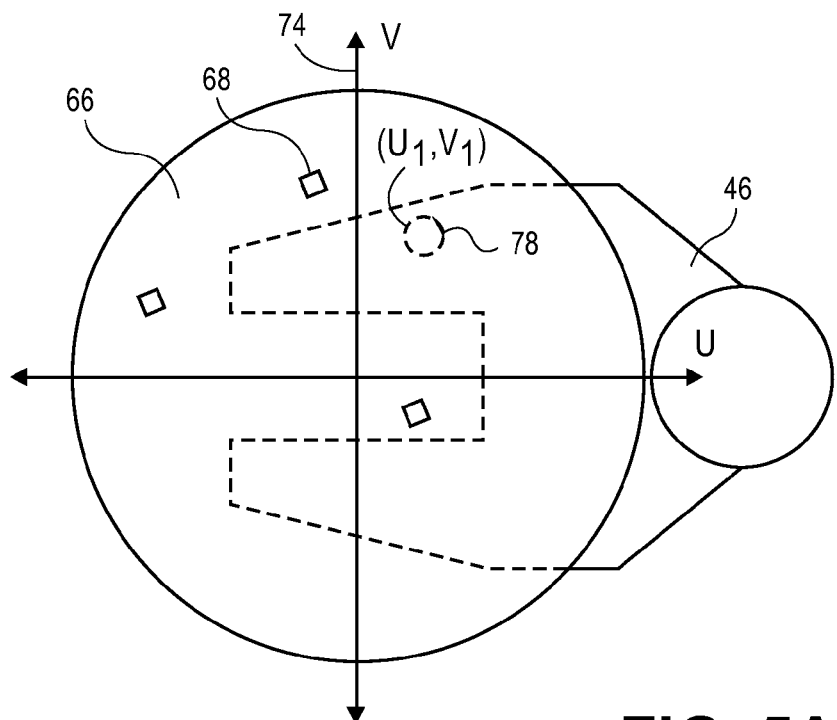
FIGS. 5A-5F are a top plan views of the calibration substrate on the substrate support within the metrology chamber illustrating calibration of the robotic stage.

FIGS. 5A-6 illustrate the calibration of the movements of the robotic arm 44.

FIGS. 5A-5F illustrate the metrology tool 10 locating the first 68, second 70, and third 72 features on the calibration substrate 66. The calibration of the metrology tool 10 is shown in FIGS. 5A-5F by illustrating the movement of the calibration substrate 66 as caused by the robotic arm relative to a field of view 78 of the upper camera 52 and/or a target from the electromagnetic radiation source subsystem 34, as illustrated in FIG. 2, which may lie on the calibration substrate 66 when the substrate support 46 positions the calibration substrate 66 in the second portion 40 of the metrology chamber 20. Although as illustrated, the field of view 78 appears to be moving, it should be understood that the robotic arm 44 may be moving the calibration substrate 66 so that the field of view 78 appears to move relative to the calibration substrate 66 as shown. The field of view 78 may be substantially circular with a diameter of approximately 2 mm.

The coordinates, as found in the U/V coordinate system 74 illustrated in FIG. 3, of the first 68 ($U_1, V_1$), second 70 ($U_2/V_2$), and third 72 ($U_3/V_3$) features may be entered into the computer control console 22. The metrology tool 10 may then attempt to locate the features 68, 70, and 72 as described below.

As illustrated specifically in FIG. 5A, using the translation between the R/θ coordinate system 80 and the X/Y coordinate system 90, the substrate support 46 may then move the calibration substrate 66 into a position which corresponds to the position of the first feature 68 in the U/V coordinate system 74 ($U_1, V_1$). In a first attempt to locate the first feature 68, the metrology tool may assume that the U/V coordinate system 74 and the X/Y coordinate system 90 are congruent.

FIG. 5A illustrates the calibration substrate 66 positioned such that the field of view 78 is positioned over the location of the first feature 68 if the U/V coordinate system 74 and the X/Y coordinate system 90 were congruent. Thus, the position of the field of view 78 in FIG. 5A may represent an "ideal" position of the first feature 68. However, because the U/V 74 and X/Y 90 coordinate systems may not actually lie directly over one another, the field of view 78 may not be located over the first feature 68 and not be in the ideal position. Using the pattern recognition software, the metrology tool 10 may then search for the first feature 68 by slight movements of both the calibration wafer 66 and the camera subsystem 32.

Figure 5B:
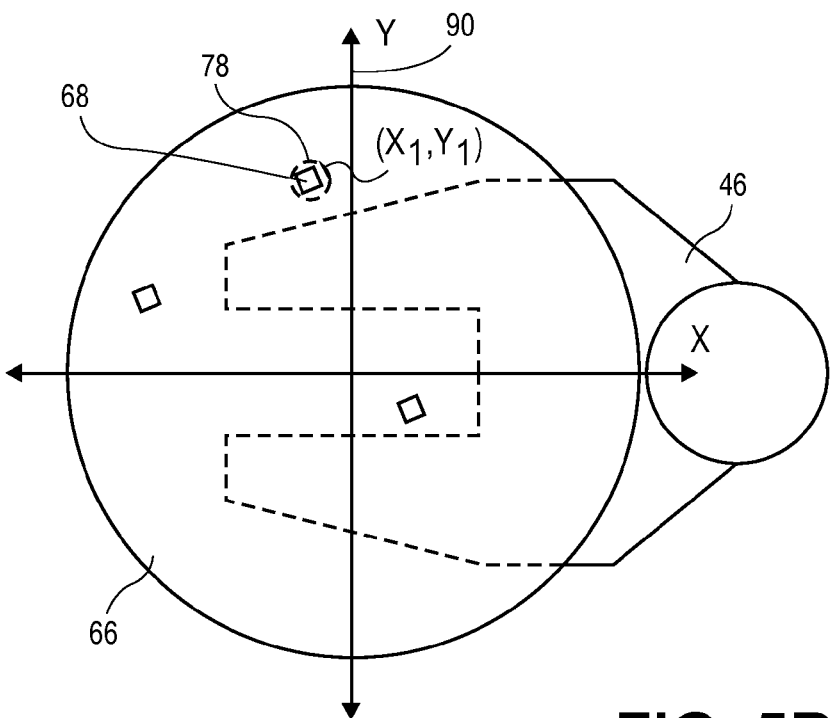

As illustrated in FIG. 5B, when the first feature 68 is located, the position of the first feature 68 in the X/Y coordinate system 90 ($X_1, Y_1$) may be plotted and stored in memory. Specifically, the movements of the substrate support 46 needed to move between $U_1, V_1$ and $X_1, Y_1$ (if the two coordinate systems were congruent) and thus locate the first feature 68 in the X/Y coordinate system 90 may be stored in memory. The position of the first feature 68 in the X/Y coordinate system 90 may be understood to be an "actual" position of the first feature 68.

Figure 5C:
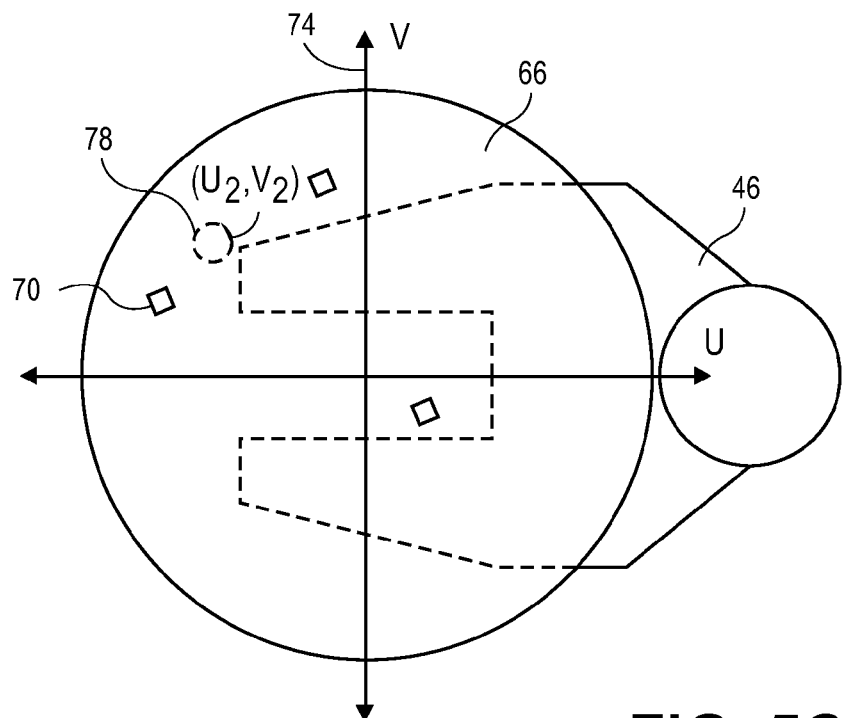

Referring to FIG. 5C, the robotic arm 44, or substrate support 46, may then move the calibration substrate 66 into a position such that the field of view 78 is positioned over the location of the second feature 70 ($U_2, V_2$) if the U/V coordinate system 74 and the X/Y coordinate system 90 were congruent. Thus, the position of the field of view 78 in FIG. 5C may represent the ideal position of the second feature 70. Again, after this movement, the field of view 78 may not be located directly over the second feature 70. The metrology tool 10 may then search for the second feature 70.

Figure 5D:
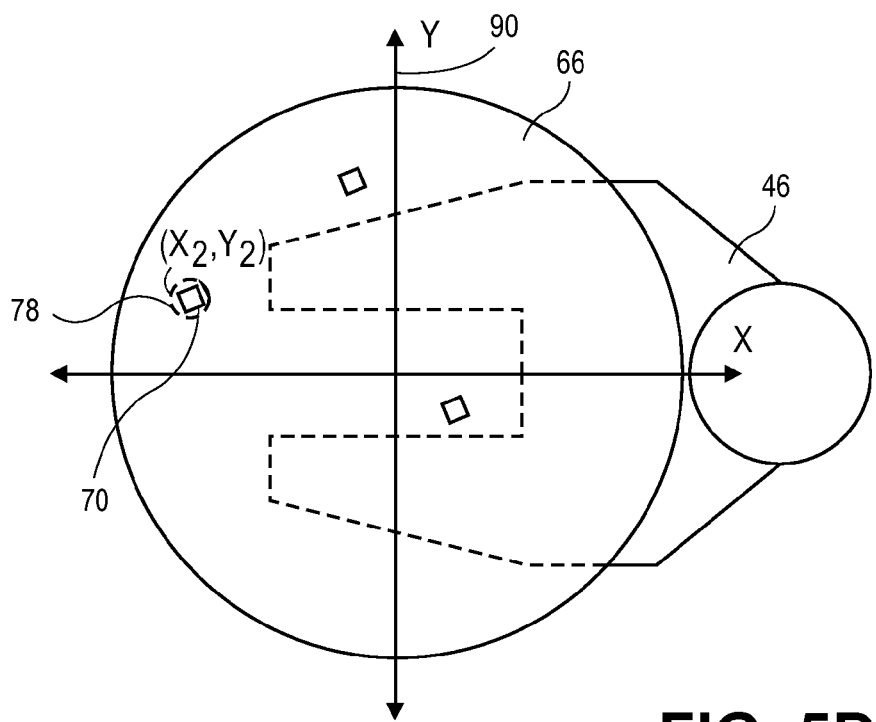

As illustrated in FIG. 5D, when the second feature 70 is located, the position of the second feature 70 in the X/Y coordinate system 90 ($X_2/Y_2$) may be plotted and stored in memory. Specifically, the movements of the substrate support 46 needed to move the calibration substrate between $U_2, V_2$ and $X_2, Y_2$ (if the two coordinate systems were congruent) and thus locate the second feature 70 in the X/Y coordinate system 90 may be stored in memory. The position of the second feature 70 in the X/Y coordinate system 90 may be understood to be the actual position of the second feature 70.

Figure 5E:
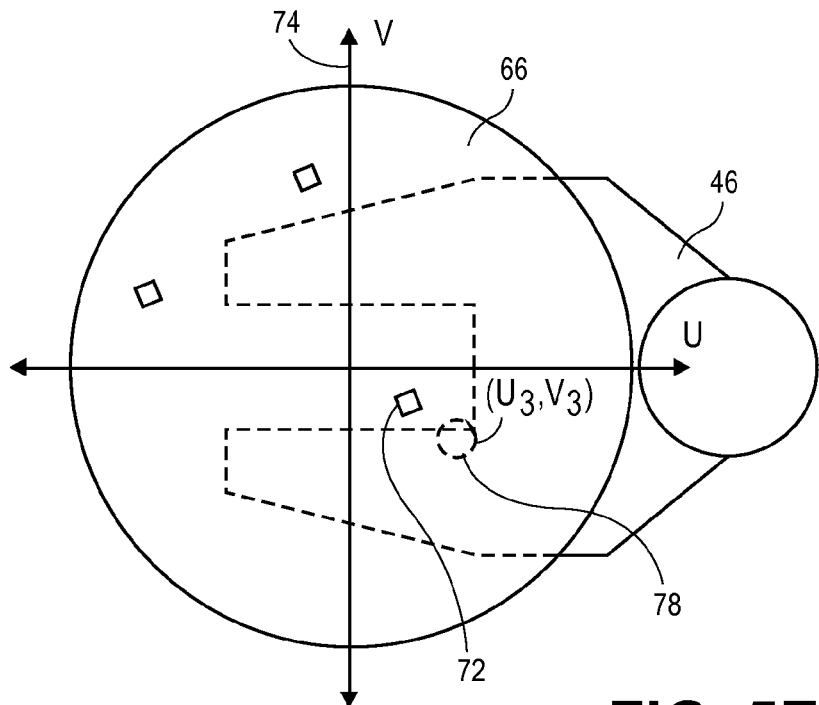

As illustrated in FIG. 5E, the substrate support 46 may then move the calibration substrate 66 into a position such that the field of view 78 is positioned over the location of the third feature 72 ($U_3, V_3$) if the U/V coordinate system 74 and the X/Y coordinate system 90 were congruent. Thus, the position of the field of view 78 in FIG. 5E may represent an ideal position of the third feature 72. As before, after this movement, the field of view 78 may not be located directly over the third feature 72. The metrology tool 10 may then search for the third feature 72.

Figure 5F:
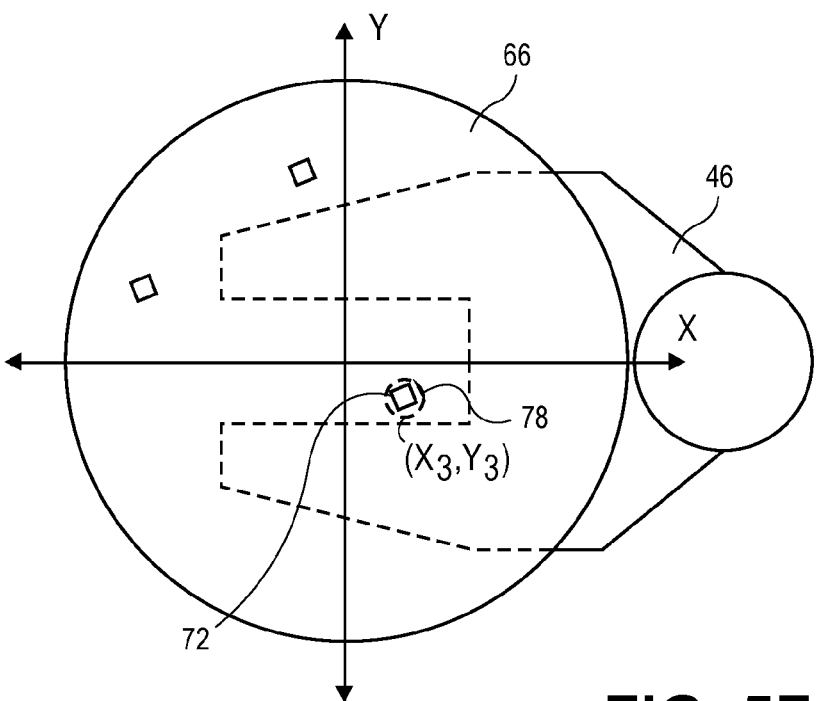

As illustrated in FIG. 5F, when the metrology tool 10 locates the third feature 72, the position of the third feature 72 in the X/Y coordinate system 90 ($X_3, Y_3$) may be plotted and stored in memory. Specifically, the movements of the substrate support 46 needed to move the calibration substrate 66 between $U_3, V_3$ and $X_3, Y_3$ and thus locate the third feature 72 in the X/Y coordinate system 90 may be stored in memory. The position of the third feature 72 in the X/Y coordinate system 90 may be understood to be the actual position of the third feature 72.

As suggested above, there may actually be thousands of features on the calibration substrate 66. The metrology tool 22 may actually utilize more than three of the features in calibrating the movements of the robotic arm 44.

Figure 6A:
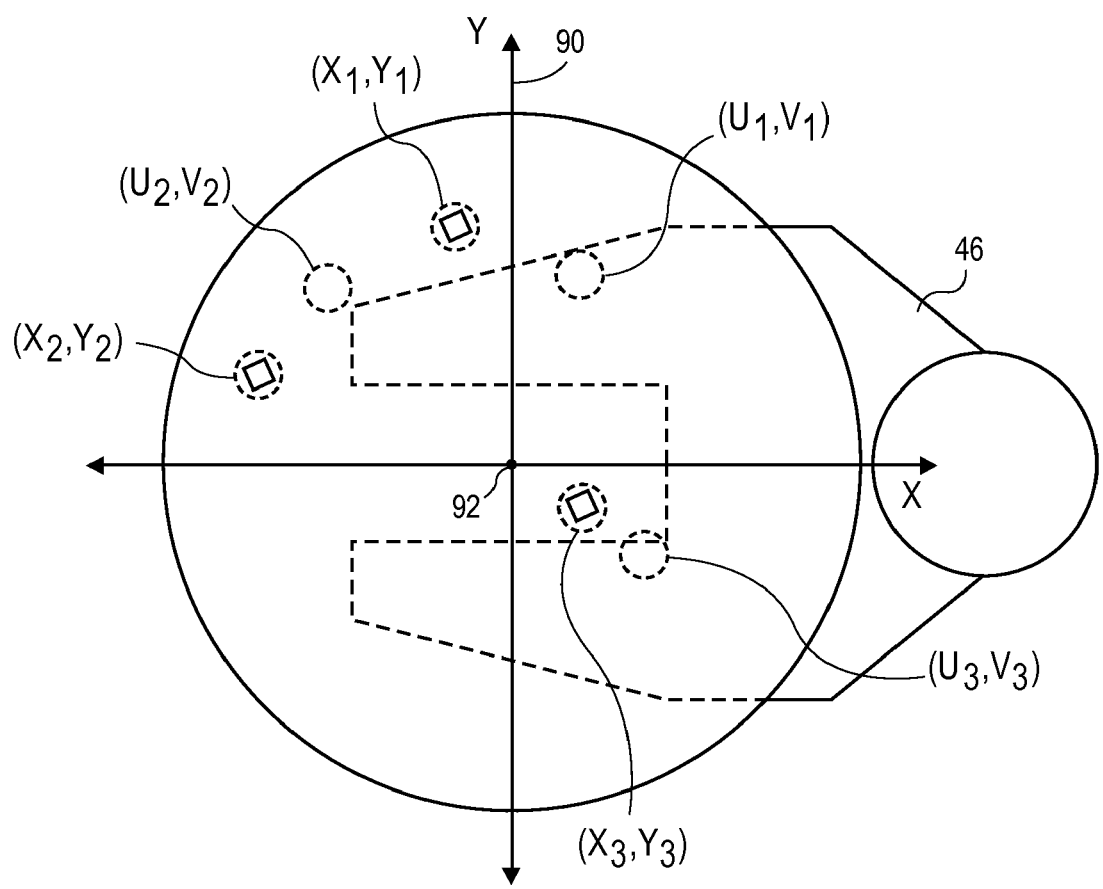
FIGS. 6A-6C are top plan views of the calibration substrate on the substrate support further illustrating the calibration, of the robotic stage.
Figure 6B:
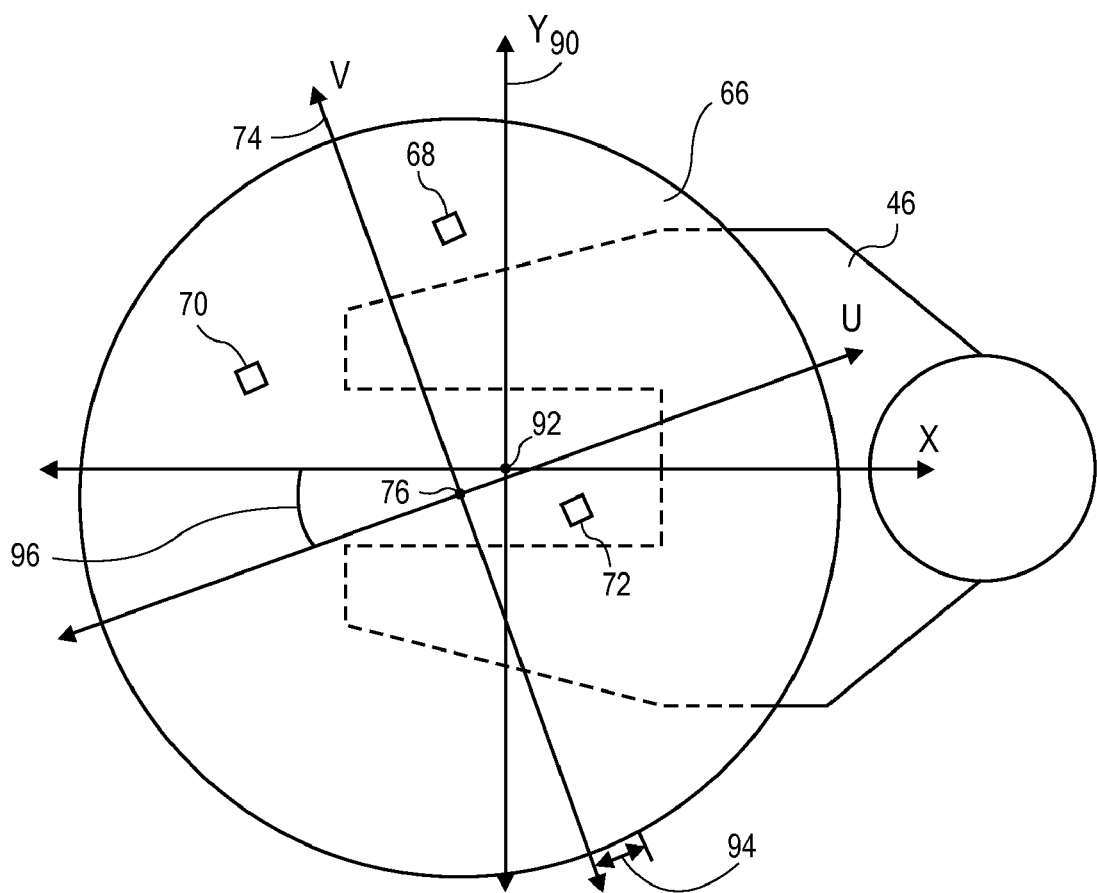
Figure 6C:
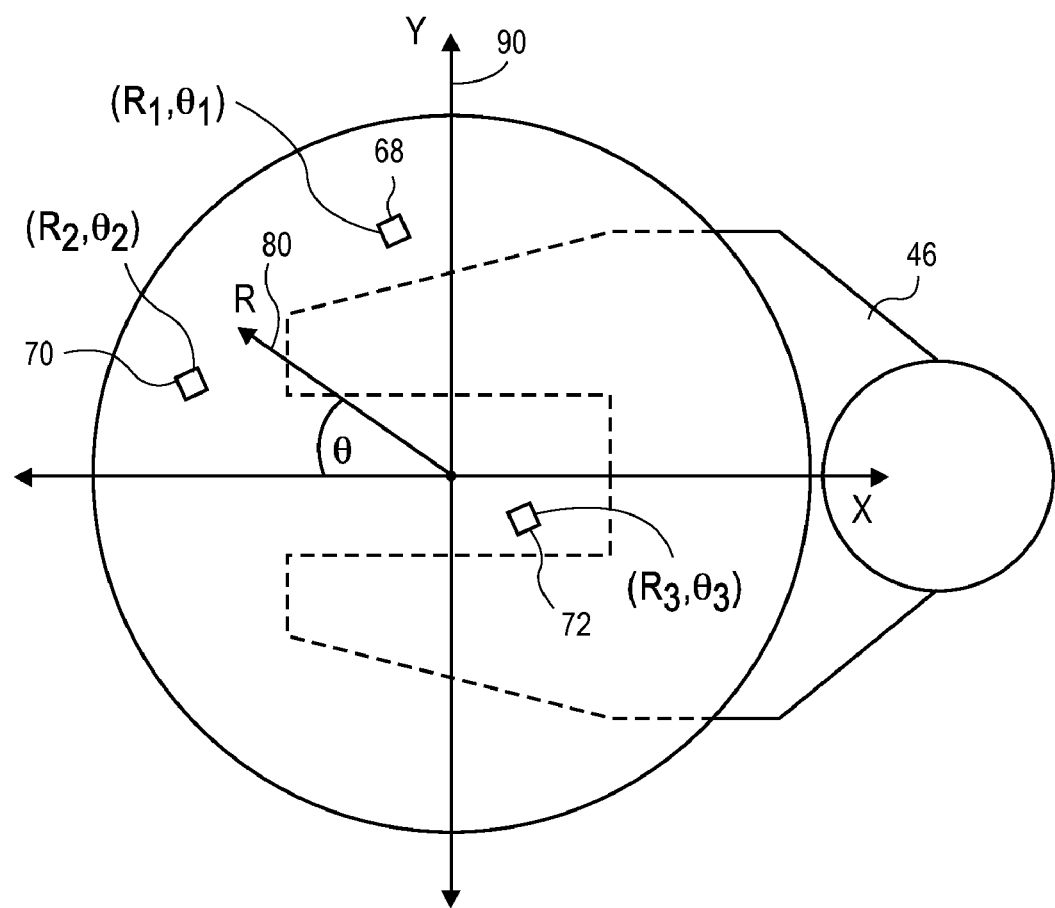

The metrology tool 10, or the computer control console 22, may then generate a calibration, a translation, or a "map," between the U/V coordinate system 74 and the X/Y coordinate system 90 as illustrated in FIGS. 6A-6C by comparing the coordinates and positions of the features 68, 70, and 72 in the U/V coordinate system 74 to the coordinates and positions of the features 68, 70, and 72 plotted in the X/Y coordinate system 90 (i.e., by comparing the ideal positions of the features to the actual positions of the features.)

FIG. 6A illustrates the coordinates and positions of all three features 68, 70, and 72 in both the U/V coordinates and the X/Y coordinates relative to the X/Y coordinate system 90. Again, for the purposes of FIG. 6A, it may be assumed that the U/V coordinate system 74 and the X/Y coordinate system 90 are congruent. Therefore, FIG. 6A may illustrate both the ideal and actual positions of each of the features 68, 70, and 72.

As illustrated in FIG. 6B, by comparing the positions of the features 68, 70, and 72 in the U/V coordinate system 74 and the positions of the features 68, 70, and 72 in the X/Y coordinate system 90, the computer control console 22 may then create a translation, or a map, between the U/V coordinate system 74 and the X/Y coordinate system 90. As shown, the generation of the translation between the U/V coordinate system 74 and the X/Y coordinate system 90 may include calculating an "offset." The offset may include an offset distance 94 and an offset angle 96. The offset distance 94 may be the distance between the origin 76 of the U/V coordinate system 74 and the origin 92 of the X/Y coordinate system 90, and the offset angle 96 may be an angle between one of the axes of the U/V coordinate system 74 and a corresponding axis of the X/Y coordinate system 90.

The offset distance 94 may be, for example, between zero and 200 microns. The offset angle 96 may be, for example, less than one degree. It should be understood that the offset illustrated in FIG. 6B may be exaggerated for illustrative purposes.

Thus, as illustrated in FIG. 6B, the U/V coordinate system 74 and the X/Y coordinate system 90 may not be congruent (i.e., the U/V 74 and the X/Y 90 coordinate systems may not lie directly over one another). In other words, the calibration substrate 66 may not be positioned directly over the center portion of the substrate support 46. This translation between the U/V coordinate system 74 and the X/Y coordinate system may be understood to represent the alignment of the calibration substrate 66 on the substrate support 46, as it shows the difference between the ideal position and actual position of the calibration substrate 66 on the substrate support 46. The comparison of the actual position of the calibration substrate 66 on the substrate support 46 and the ideal position of the calibration substrate 66 on the substrate support 46 may be referred to as "substrate alignment," or "wafer alignment."

As previously mentioned, it should also be understood that the offset observed between the U/V coordinate system 74 and the X/Y coordinate system 90 may also be a result of the inherent inaccuracy and imprecision of the movements of the robotic arm 44, as will be appreciated by one skilled in the art. Thus, FIG. 6B may illustrate the actual position of the calibration substrate 66 (and/or the U/V coordinate system 74) compared to the substrate support 46 (and/or the X/Y coordinate system 90).

As illustrated in FIG. 6C, the computer control console 22 may then translate the positions of the features 68, 70, and 72 in the X/Y coordinate system 90 to positions in the R/θ coordinate system 80 (i.e., $R_1, \theta_1$; $R_2, \theta_2$; and $R_3, \theta_3$) using the translation between the R/θ coordinate system 80 and the X/Y coordinate system 90 illustrated in FIG. 4.

Figure 7:
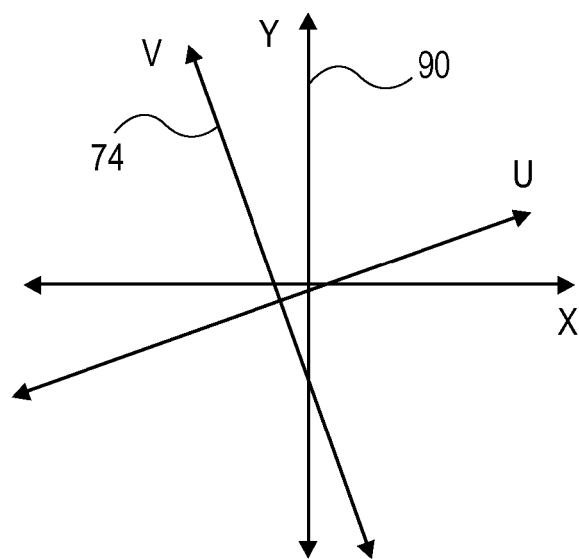
FIG. 7 is a schematic view of the calibration process illustrated in FIGS. 6A-6C.
Figure 7:
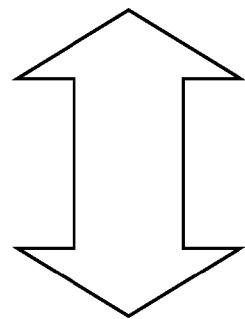
Figure 7:
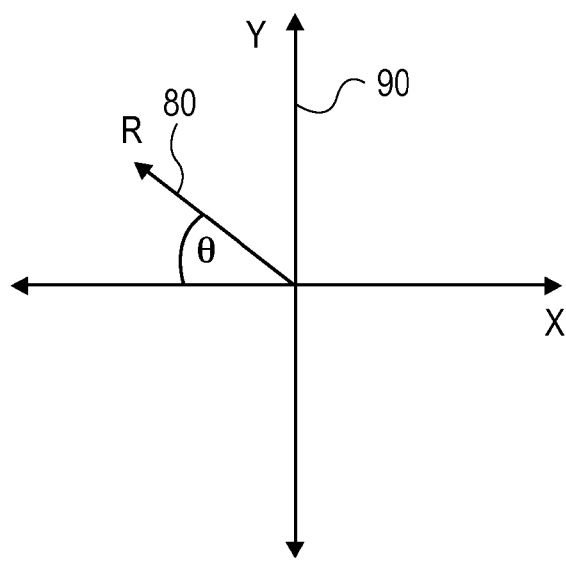

Thus, as illustrated FIG. 7, the computer control console 22 may be able to translate positions on the calibration substrate 66 in the U/V coordinate system 74 into positions in the X/Y coordinate system 90 and then translate the positions in the X/Y coordinate system 90 into positions in the R/θ coordinate system 80 which may directly correspond to the movement of the robotic arm 44.

Using the above translations between the three coordinate systems described above, the metrology tool 10 may be able to quickly calculate the actual position of a feature when only given the ideal position of the feature (in the U/V coordinate system 74).

After the calibration of the metrology tool 10 has been completed, referring again to FIG. 1, the calibration substrate 66 may be moved by the robotic arm 44 back into the load-lock chamber 18, removed from the load-lock chamber 18 by the transport mechanism 26, and placed back into one of the cassettes 14.

Figure 8A:
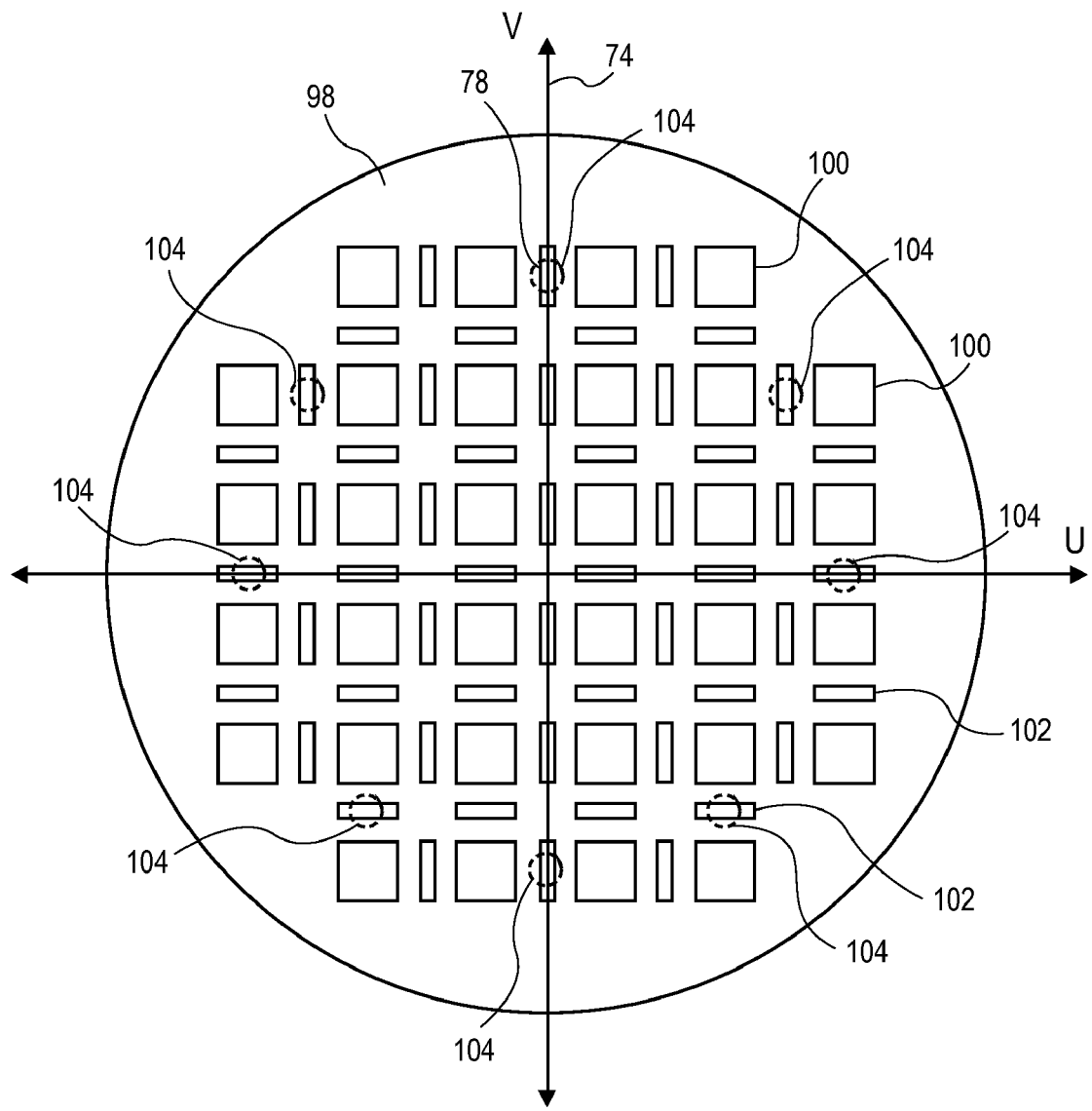
FIGS. 8A and 8B are top plan views of a test substrate.

Still referring to FIG. 1, a device substrate 98 may then be placed into one of the cassettes 14 and transported into the metrology chamber 20. FIG. 8A illustrates an example of a device substrate 98. The device substrate 98 may be a semiconductor wafer with a diameter of, for example 200 or 300 mm. The device substrate 98 may have a plurality of integrated circuits 100 formed thereon divided amongst multiple dice, as is commonly understood in the art. The formation of the integrated circuits 100 may only be partially completed. The device substrate 98 may also include a plurality of metrology pads 102 located between the integrated circuits 100. The metrology pads 102 may be, for example, rectangular with dimensions of 120 microns by 50 microns.

Before the testing of the device substrate 98 has begun, the user may enter a plurality of points 104, in the U/V coordinate system 74 on the substrate 98, to be tested on the device substrate 98. The points 104 may correspond to some, or all, of the metrology pads 102 on the device substrate 98.

The device substrate 98 may be moved by the robotic arm 44 into the second portion 40 of the metrology chamber 20, similarly to the calibration substrate 66, as illustrated in FIG. 2.

Before the testing of the device substrate 98 begins, the metrology tool 10 may locate the positions of several of the metrology pads 102 in a manner similar to that illustrated in FIGS. 5A-6C, to determine the substrate alignment for the device substrate 98 (i.e., determine the actual position of the device substrate 98 on the substrate support 46).

Figure 8B:
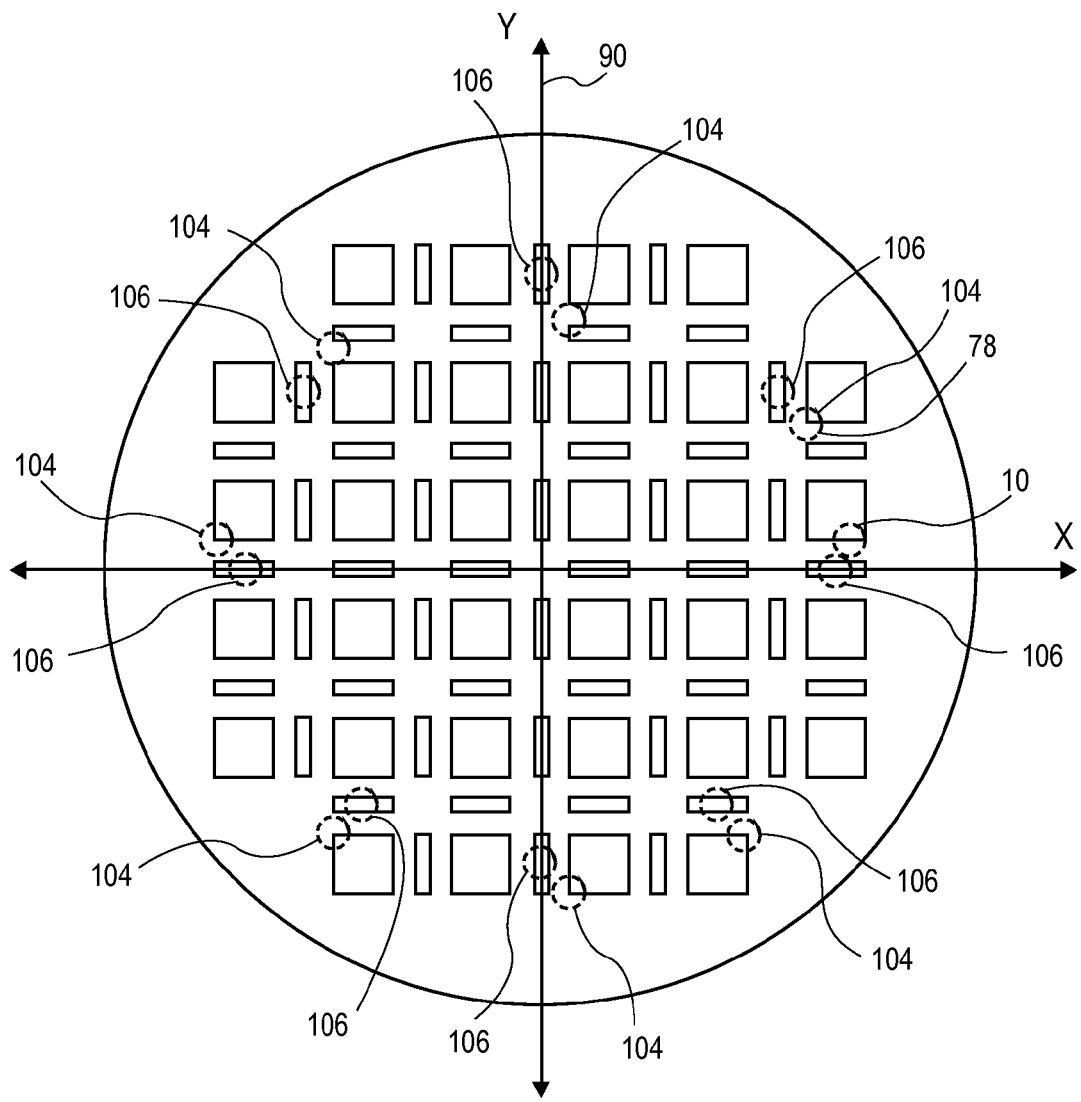

FIG. 8B illustrates the movement of the device substrate 98 relative to the field of view 78 as the device substrate 98 is tested. Using the translations between the U/V, X/Y, and R/8 coordinate systems described above, the robotic arm 44 may move the test substrate 98 directly into positions corresponding to the points 106 on the test substrate that are to be tested in the X/Y coordinate system 90. It should be noted that FIG. 8B illustrates the test substrate 98 relative to the X/Y coordinate system 90 and that the positions of the points 104 to be tested in the U/V coordinate system are merely shown for illustrative purposes, as the test substrate may be moved directly to the corresponding X/Y positions.

Referring to FIG. 2, each time the test substrate 98 is moved into a particular position, the camera subsystem 32 and the pattern recognition software may be used to verify that the particular point (or feature) to be tested is actually within the target area of the electromagnetic radiation source subsystem 34. If the feature is not within the target area, the metrology tool 10 may use slight movements of the substrate support 46 to locate the particular feature. If necessary, the camera subsystem 32 and the electromagnetic radiation source subsystem 34 may also be moved (or redirected) in order to find the feature. If the feature is still not able to be located, the computer control console 22 may notify the user using an alarm.

If necessary, the metrology tool 10 may also be recalibrated by reintroducing the calibration substrate 66 into the metrology tool 10 performing another calibration similar to that illustrated in FIGS. 5A-7C.

When a particular feature is within the target area, the electromagnetic radiation source subsystem 34 may be activated and emit electromagnetic radiation, such as x-rays or visible light, onto the portion of the device substrate 98 lying within the target area. The target area may lie within the field of view 78 and be, for example, substantially rectangular with dimensions of 100 microns by 30 microns. As is commonly understood in the art, as the electromagnetic radiation bombards the material on the feature, at the atomic level, electrons within the material may become energized and be ejected from their respective orbits of the nuclei of the atoms within the materials on the device substrate 98. The electrons may pass through the reticle and enter the detector of the electron spectrometer or hemispherical analyzer. The electrons may then be analyzed, as is commonly understood in the art. The electron spectrometer or hemispherical analyzer may determine the composition of the material of the feature on the test substrate based on the kinetic energy, or speed, of the electrons.

After all of the features on the device substrate 98 have been tested, the device substrate 98 may be removed from the metrology tool 10, and a second device substrate may be tested.

FIGS. 9A-9D illustrate movements of the substrate support 46 with a substrate placed thereon as the substrate is moved between various positions, which as before are illustrated by the apparent movements of the field of view 78. In particular, FIGS. 9A-9D illustrate a "backlash" correction of the movements of the substrate support 46. As is described below in more detail, each time the substrate support 46 is moved into a particular position, the substrate support 46 may first be moved into an "incorrect" position. Each "incorrect" position lie from its-respective correct position in the same direction. Thus, each time the substrate support 46 is moved into a desired position, it is moved into that position in the same direction.

Figure 9A:
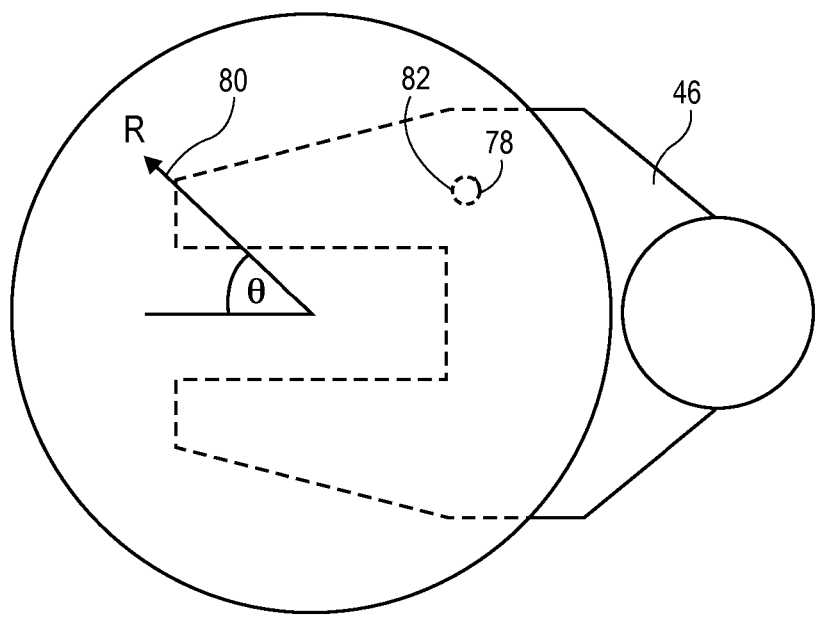
FIGS. 9A-9D are top plans views of a substrate on the substrate support illustrating movement of the substrate support.
Figure 9B:
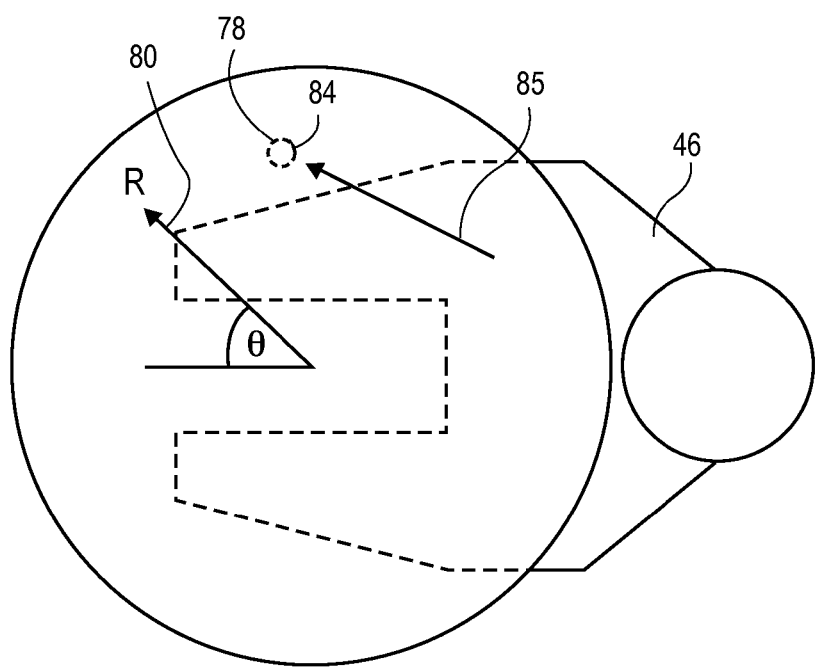
Figure 9C:
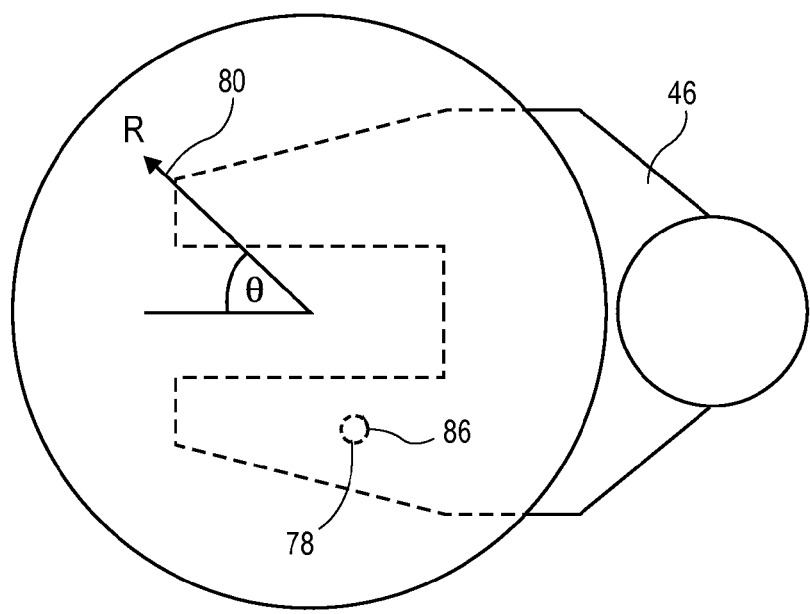
Figure 9D:
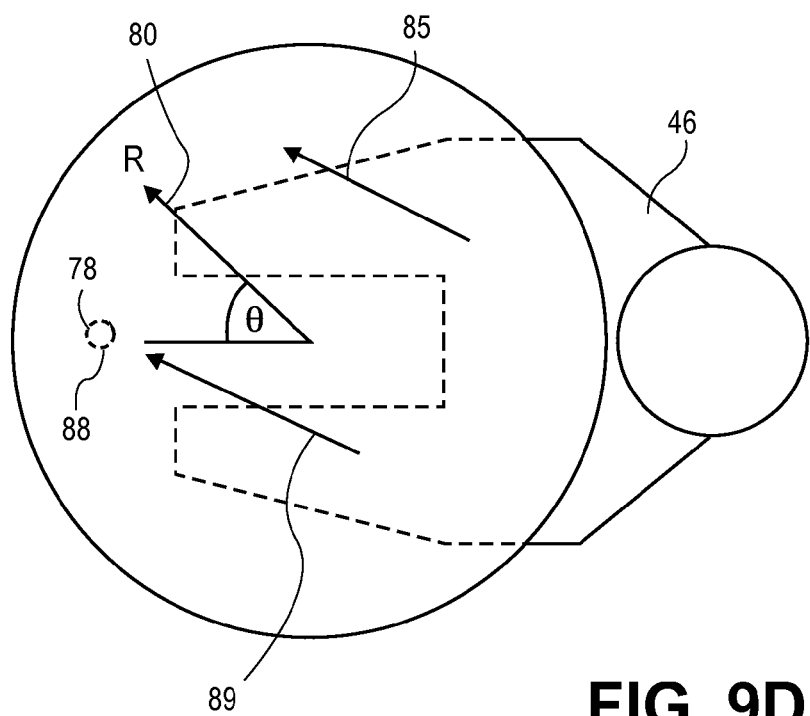

As illustrated in FIG. 9A, the substrate may first be placed in a first position 82. Then, as illustrated in FIG. 9B, the substrate may be moved from the first position 82 into a second position 84 in a first direction 85. As illustrated in FIGS. 9C and 9D, the substrate may then be moved into a third position 86 before being moved into a fourth position 88 in a second direction 89. It should be noted that the positions 82, 84, 86, and 88 may not be linear relative to one another.

As illustrated in FIG. 9D, the second direction 89 may be substantially parallel to the first direction 85. Thus, the substrate may be moved into the second 84 and fourth 88 directions in the same direction. Although only several positions are shown, it should be understood that the substrate may be moved into literally thousands of positions with the robotic stage 30 controlled such that the substrate is moved into each of those positions in the same direction.

It should also be noted that although directions 85 and 89 appear to be linear, each direction 85 and 89 may be considered a vector which comprises an angular and a radial component, as is dictated by the movements of the substrate support 46 within the polar coordinate system 80. Therefore, the backlash correction described above may be understood to comprise moving the substrate support 46 into an "offset" position before moving the substrate support 46 into the desired position. All of the offset positions may thus be located from their respective desired positions in the same angular direction (θ) and distance (R).

The movement of the substrate illustrated in FIG. 9A-9D may be utilized in the calibration, as well as other movements, of the calibration substrate 66 and device substrate 98 illustrated in FIGS. 5A-8B. Therefore, each time the substrates are moved into any of the positions, the substrates are moved in the same direction.

One advantage is that the robotic stage may be used to retrieve substrates from the load-lock chamber, as well as position the substrates under the electromagnetic radiation source subsystem. Therefore, a separate machine is not needed to remove the substrates from the load-lock chamber which reduces the cost of the metrology system. Another advantage is that because of the calibration between the coordinate system on the substrates and the coordinate systems of the robotic arm, the precision and the accuracy of the positioning of the substrates is increased. Thus, the likelihood of damaging any of the integrated circuits is decreased. The metrology tool may be able to locate the features well within 100 microns of the actual position. The error of the metrology tool 10 may even be within 50 microns, even as low as 10 microns. Therefore, the size of the features on the substrates that are to be tested, and thus manufactured, may be minimized. A further advantage is that because the substrate is moved in the same direction every time the substrate is moved to any position, the precision and accuracy of the positioning of the substrate is even further increased.

Referring again to FIG. 2, the lower camera may be used in conjunction with a third Cartesian coordinate system marked on a lower surface of the substrate support. The use of the lower camera together with the third Cartesian coordinate may further increase the precision and accuracy of the positioning of the substrate.

Other embodiments may use an electron gun, along with an anode and a monochromator, as is commonly understood in the art, to generate x-rays rather than an x-ray gun. Likewise, the metrology tool may utilize any of known analysis protocol, such as XPS, TXRF, and ellipsometry. The sizes and shapes of the metrology pads may vary. For example, the metrology pads may be substantially square with side lengths of 150 or 50 microns.

While certain exemplary embodiments have been described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art.

The invention claimed is:

1. A semiconductor substrate processing system comprising:
    a frame;
    a chamber wall enclosing a chamber, the chamber having a first portion and a second portion;
    a load-lock chamber connected to the frame and being adjacent to the first portion of the chamber;
    a robotic stage having a base and a robotic arm, the base being connected to the frame and positioned within the first portion of the chamber, the robotic arm being rotatably connected to the base to transport a semiconductor substrate from the load-lock chamber to the second portion of the chamber into a test position;
    an x-ray source connected to the frame to emit x rays onto the semiconductor substrate, the x rays causing photoelectrons to be emitted from a material on the semiconductor substrate while in the test position;
    an analyzer connected to the frame to capture the photoelectrons and determine the kinetic energy of the photoelectrons; and
    a controller being electrically connected to and to control the robotic stage, the x ray source, and the analyzer.

2. The semiconductor substrate processing system of claim 1, further comprising a camera being electrically connected to the controller to image a portion of the semiconductor substrate.

3. The semiconductor substrate processing system of claim 2, wherein the x rays strike the imaged portion of the semiconductor substrate.

4. The semiconductor substrate processing system of claim 3, wherein the x ray source and the camera are moveably connected to the frame to move the imaged portion of the semiconductor substrate.

5. The semiconductor substrate processing system of claim 4, wherein the controller includes a processor and a memory storing instructions, which when executed by the processor causes the system to perform a method, the method comprising:
    providing a calibration semiconductor substrate having a surface and a plurality of features on the surface, each feature being positioned on the surface at a first respective point in a first coordinate system;
    plotting the position of each feature at a second respective point in a second coordinate system; and
    generating a translation between the first and the second coordinate systems.

6. The semiconductor substrate processing apparatus of claim 5, wherein the method further comprises:
    providing a test semiconductor substrate having a surface and a plurality of second features on the surface, each second feature being positioned on the surface of the test semiconductor substrate at a third respective point in the first coordinate system;
    translating the third respective points in the first coordinate system into fourth respective points in the second coordinate system; and
    moving the test semiconductor substrate into a plurality of substrate positions, each substrate position corresponding to one of the fourth respective points in the second coordinate system.

7. The semiconductor substrate processing apparatus of claim 6, wherein the plurality of substrate positions comprises a first substrate position, a second substrate position, and a third substrate position.

8. The semiconductor substrate processing apparatus of claim 7, wherein each time the second semiconductor substrate is moved into the first, second, and third substrate positions, the second semiconductor substrate is moved in a first direction.

9. The semiconductor substrate processing apparatus of claim 8, wherein the robotic arm moves in a third coordinate system.

10. The semiconductor substrate processing apparatus of claim 9, further comprising generating a translation between the third coordinate system and the second coordinate system.

11. The semiconductor substrate processing apparatus of claim 10, wherein the first and second coordinate systems are Cartesian coordinate systems and the third coordinate system is a polar coordinate system.

12. A semiconductor substrate processing system comprising:
- a frame;
- a chamber wall enclosing a chamber, the chamber having a first portion and a second portion;
- a load-lock chamber connected to the frame and being adjacent to the first portion of the chamber;
- a robotic stage having a base and a robotic arm, the base being connected to the frame and positioned within the first portion of the chamber, the robotic arm being rotatably connected to the base to transport a semiconductor substrate from the load-lock chamber to the second portion of the chamber into a test position;
- an electromagnetic radiation source connected to the frame to emit electromagnetic radiation onto the semiconductor wafer, the electromagnetic radiation causing photoelectrons to be emitted from a material on the semiconductor substrate while in the test position;
- an analyzer connected to the frame to capture the photoelectrons and determine the kinetic energy of the photoelectrons;
- a controller being electrically connected to and to control the robotic stage, the electromagnetic radiation source, and the analyzer, wherein the controller includes a processor and a memory storing instructions, which when executed by the processor causes the system to perform a method, the method comprising:
  - providing a calibration semiconductor substrate having a surface and a plurality of features on the surface, each feature being positioned on the surface at a first respective point in a first coordinate system;
  - plotting the position of each feature at a second respective point in a second coordinate system; and
  - generating a translation between the first and the second coordinate systems; and
- a camera being electrically connected to the controller to image a portion of the semiconductor substrate, wherein the electromagnetic radiation strikes the imaged portion of the semiconductor substrate, and wherein the electromagnetic radiation source and the camera are moveably connected to the frame to move the imaged portion of the semiconductor substrate.

13. The semiconductor substrate processing apparatus of claim 12, wherein the method further comprises:
- providing a test semiconductor substrate having a surface and a plurality of second features on the surface, each second feature being positioned on the surface of the test semiconductor substrate at a third respective point in the first coordinate system;
- translating the third respective points in the first coordinate system into fourth respective points in the second coordinate system; and
- moving the test semiconductor substrate into a plurality of substrate positions, each substrate position corresponding to one of the fourth respective points in the second coordinate system.

14. The semiconductor substrate processing apparatus of claim 13, wherein the plurality of substrate positions comprises a first substrate position, a second substrate position, and a third substrate position.

15. The semiconductor substrate processing apparatus of claim 14, wherein each time the second semiconductor substrate is moved into the first, second, and third substrate positions, the second semiconductor substrate is moved in a first direction.

16. The semiconductor substrate processing apparatus of claim 15, wherein the robotic arm moves in a third coordinate system.

17. The semiconductor substrate processing apparatus of claim 16, further comprising generating a translation between the third coordinate system and the second coordinate system.

18. The semiconductor substrate processing apparatus of claim 17, wherein the first and second coordinate systems are Cartesian coordinate systems and the third coordinate system is a polar coordinate system.

19. A semiconductor substrate processing system comprising:
- a frame;
- a chamber wall enclosing a chamber, the chamber having a first portion and a second portion;
- a load-lock chamber connected to the frame and being adjacent to the first portion of the chamber;
- a robotic stage having a base and a robotic arm, the base being connected to the frame and positioned within the first portion of the chamber, the robotic arm being rotatably connected to the base to transport a semiconductor substrate from the load-lock chamber to the second portion of the chamber into a test position;
- an electromagnetic radiation source connected to the frame to emit electromagnetic radiation onto the semiconductor wafer, the electromagnetic radiation causing photoelectrons to be emitted from a material on the semiconductor substrate while in the test position;
- an analyzer connected to the frame to capture the photoelectrons and determine the kinetic energy of the photoelectrons; and
- a controller being electrically connected to and to control the robotic stage, the electromagnetic radiation source, and the analyzer, wherein the controller includes a processor and a memory storing instructions, which when executed by the processor causes the system to perform a method, the method comprising:
  - providing a calibration semiconductor substrate having a surface and a plurality of features on the surface, each feature being positioned on the surface at a first respective point in a first coordinate system;
  - plotting the position of each feature at a second respective point in a second coordinate system; and
  - generating a translation between the first and the second coordinate systems.

20. The semiconductor substrate processing apparatus of claim 19, wherein the method further comprises:
- providing a test semiconductor substrate having a surface and a plurality of second features on the surface, each second feature being positioned on the surface of the test semiconductor substrate at a third respective point in the first coordinate system;
- translating the third respective points in the first coordinate system into fourth respective points in the second coordinate system; and
- moving the test semiconductor substrate into a plurality of substrate positions, each substrate position corresponding to one of the fourth respective points in the second coordinate system.

* * * * *